United States Patent
Yanagigawa et al.

(10) Patent No.: US 7,439,795 B2
(45) Date of Patent: Oct. 21, 2008

(54) CHARGE PUMP CIRCUIT WITH REDUCED PARASITIC CAPACITANCE

(75) Inventors: Hiroshi Yanagigawa, Shiga (JP); Masayuki Ida, Shiga (JP); Kazunori Doi, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/926,704

(22) Filed: Oct. 29, 2007

(65) Prior Publication Data

US 2008/0111598 A1    May 15, 2008

(51) Int. Cl.
  G05F 3/16   (2006.01)
  H02M 3/04   (2006.01)
  H02M 3/07   (2006.01)

(52) U.S. Cl. ..................................... 327/536
(58) Field of Classification Search ................ 327/536
  See application file for complete search history.

(56) References Cited

U.S. PATENT DOCUMENTS 5,081,371 A * 1/1992 Wong .......................... 327/536
5,828,095 A * 10/1998 Merritt ........................ 257/299

FOREIGN PATENT DOCUMENTS

JP          9-266281 A       10/1997

\* cited by examiner

*Primary Examiner*—Evan Pert
(74) *Attorney, Agent, or Firm*—Sughrue Mion, PLLC

(57) ABSTRACT

A charge pump circuit is provided with a capacitor for generating a boosted voltage from a power supply voltage in response to a clock signal; and an output node from which the boosted voltage is externally outputted. The capacitor includes a first well formed within a substrate, a second well formed within the first well, first and second diffusion regions formed within the second well to receive the clock signal, a channel region provided between the first and second diffusion regions in which channel region a channel is formed in response to the clock signal; and an electrode positioned over the channel region across a dielectric and connected with the output node. The output node is also connected with the first well to apply said boosted voltage to the first well.

9 Claims, 3 Drawing Sheets

CHARGE PUMP CIRCUIT WITH REDUCED PARASITIC CAPACITANCE

This application claims the benefit of priority based on Japanese Patent Application No. 2006-307358, filed on Nov. 14, 2006, the disclosure of which is incorporated herein by reference.

BACKGROUND OF THE INVENTION

1. Field of the Invention

The present invention relates to charge pump circuits.

2. Description of the Related Art

Semiconductor devices often require a voltage higher than the power supply voltage supplied from a power source circuit integrated within the semiconductor devices. For example, a floating-gate nonvolatile memory device uses a voltage higher than the power supply voltage in data write operations and data erase operations. Such semiconductor storage devices often incorporate a booster circuit for generating the high voltage. The charge pump is one of the most typical booster circuit topologies. A charge pump is provided with a plurality of MOS capacitors and generates a high voltage by using the MOS capacitors, as disclosed in Japanese Laid-Open Patent Application No. JP-A Heisei 9-266281, referred to as the '281 application, hereinafter.

FIG. 1 is a cross sectional diagram showing the structure of a MOS capacitor integrated within a charge pump circuit disclosed in the '281 application. The MOS capacitor $TR_1$ is composed of an NMOS transistor with a triple-well structure. The MOS capacitor $TR_1$ is provided with an N-well 122 formed within a P-type substrate 121, a P-well 124 formed within the N-well 122, $N^+$ regions 126, 127 formed within the P-well 124, and a $P^+$ region 128 also formed within the P-well 124. A gate dielectric 129 is formed on the P-well 124, and a gate electrode 130 is formed on the gate dielectric 129. The gate electrode 130 is connected to a node to be boosted within the charge pump circuit. The $N^+$ regions 126, 127 and the p-well 124 are connected to an input terminal Ts which receives a clock signal CLK. The input terminal Ts may receive an inverted clock signal/CLK, instead of the clock signal CLK.

In using the MOS capacitor $TR_1$, the N-well 122 is biased with the power supply voltage VDD and the P-type substrate 121 is biased with the ground voltage VSS. This effectively suppresses the flow of the pn junction leak current into the MOS capacitor.

The advantage of the MOS capacitor of FIG. 1 is that the capacitance C thereof does not depend on the gate-source voltage Vgs. This allows operating the charge pump circuit on a reduced power supply voltage, effectively improving the efficiency of the charge pump circuit. The reduction in the power supply voltage and the improvement of the efficiency is advantageous for the reduction in the development cost.

One issue of the MOS capacitor TR1 shown in FIG. 1 is the increased parasitic capacitance between the N-well 122 and the P-well 124. As stated above, the N-well 122 is biased with the power supply voltage VDD, while the power supply voltage VDD and the ground voltage VSS are alternately applied to the P-well 124. When the p-well well 124 is pulled up to the power supply voltage VDD, the parasitic capacitance is increased between the N-well 122 and the P-well 124. When the power supply voltage VDD is applied to both of the N-well 122 and the P-well 124, the depletion layer width between the N-well 122 and the P-well 124 is decreased, and thereby the parasitic capacitance therebetween is increased. The increased parasitic capacitance undesirably causes a problem of the increase in the consumption current in the charge pump circuit.

SUMMARY

In one embodiment of the present invention, a charge pump circuit is provided with at least one capacitor for generating a boosted voltage from a power supply voltage in response to a clock signal; and an output node from which the boosted voltage is externally outputted. The capacitor includes a first well formed within a substrate, a second well formed within the first well, first and second diffusion regions formed within the second well to receive the clock signal, a channel region provided between the first and second diffusion regions in which channel region a channel is formed in response to the clock signal; and an electrode positioned over the channel region across a dielectric and connected with the output node. The output node is also connected with the first well to apply said boosted voltage to the first well.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, a description is given of a booster circuit incorporating a charge pump circuit designed to generate a boosted voltage having a voltage level four times a voltage level of a power supply voltage.

Figure 1:
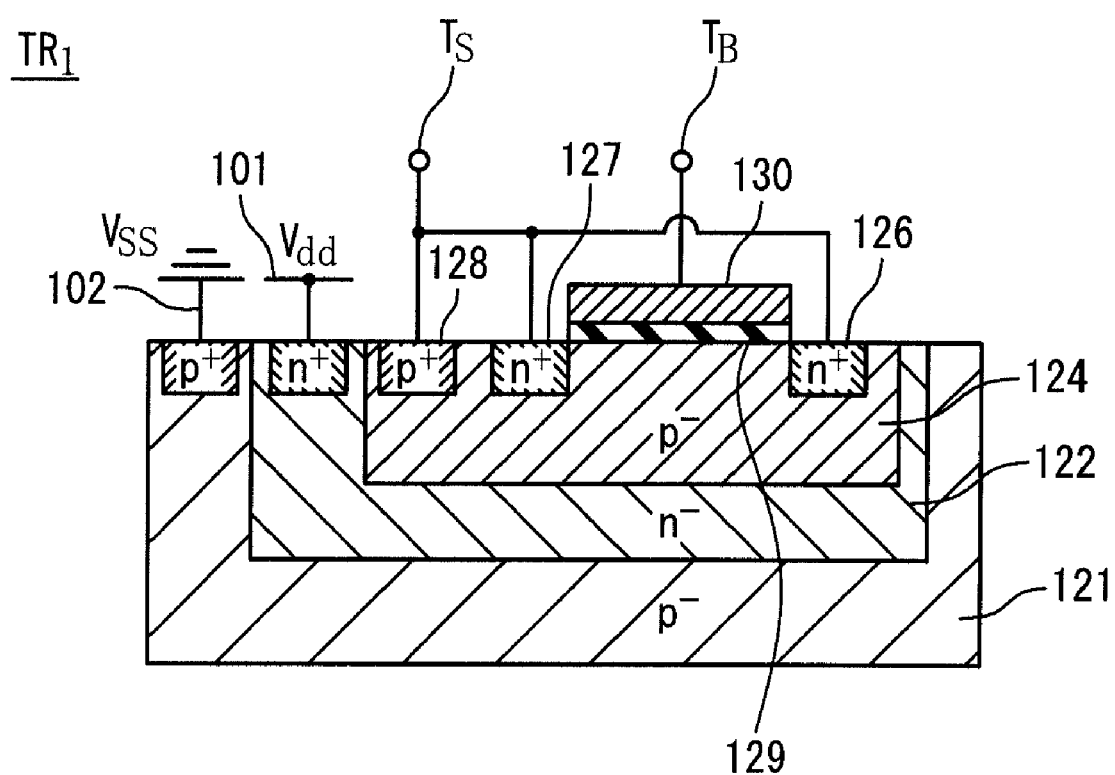
FIG. 1 is a cross sectional view showing the structure of a conventional MOS capacitor.
Figure 2:
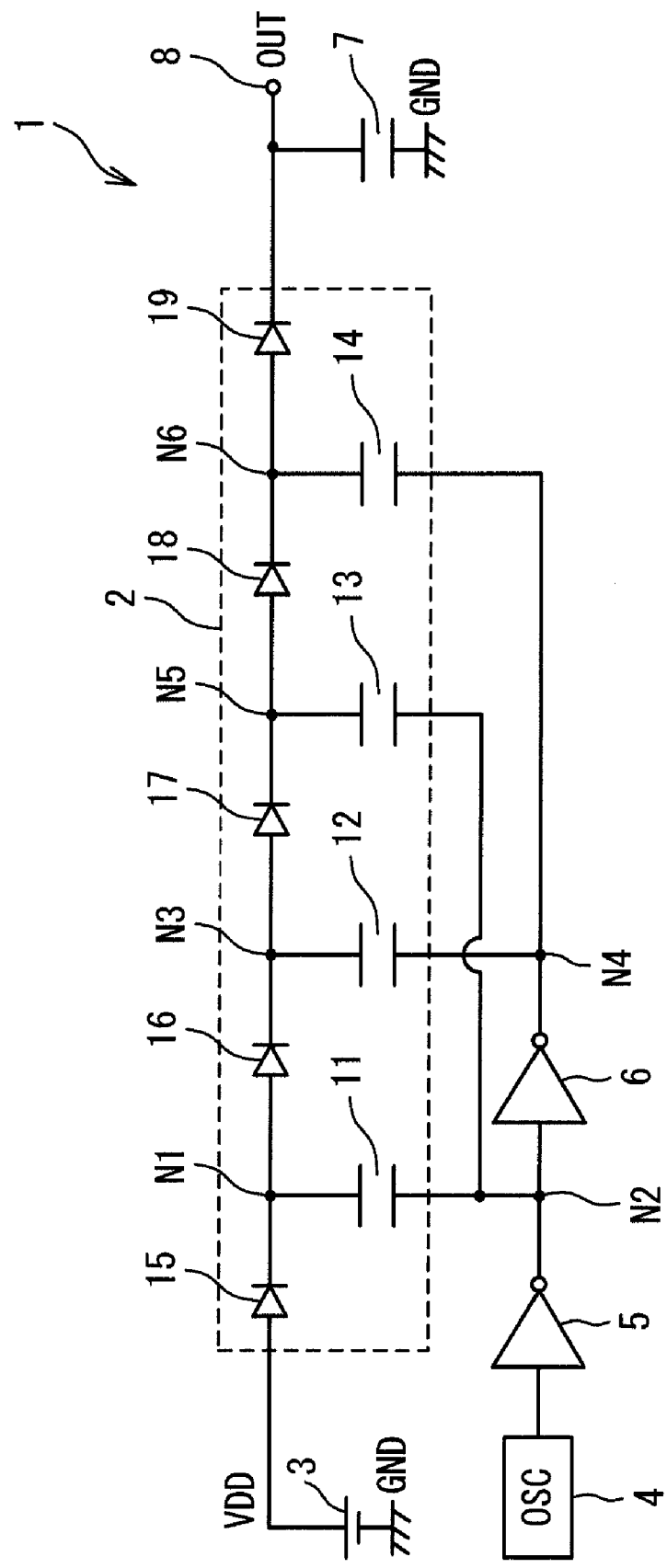
FIG. 2 is a circuit diagram showing an exemplary circuit configuration of a charge pump circuit in one embodiment of the present invention.

FIG. 2 is a circuit diagram showing a circuit configuration of a booster circuit 1 in one embodiment of the present invention. The booster circuit 1 is provided with a charge pump circuit 2, a power supply circuit 3, an oscillation circuit 4, a first inverter 5, a second inverter 6, an output capacitor 7, and an output node 8.

The charge pump circuit 2 includes serially-connected diodes 15 to 19, and first to fourth MOS capacitors 11 to 14 connected to the respective connection nodes of the diodes 15 to 19. The connection nodes may be referred to as the boost nodes, hereinafter, because boosted voltages are generated on the respective connection nodes by the first to fourth MOS capacitors 11 to 14. The first MOS capacitor 11 is connected between a first boost node N1 and a first clock supply node N2. The second MOS capacitor 12 is connected between a second boost node N3 and a second clock supply node N4. The third MOS capacitor 13 is connected between the first clock supply node N2 and a third boost node N5. The fourth MOS capacitor 14 is connected between the second clock supply node N4 and a fourth boost node N6.

Referring to FIG. 2, the diodes 15 to 19 are connected in series between the power supply circuit 3 and the output node 8. The first diode 15 has an anode connected to the power supply circuit 3 and a cathode connected to the first boost node N1. The second diode 16 has an anode connected to the first boost node N1 and a cathode connected to the second boost node N3. The third diode 17 has an anode connected to the second boost node N3 and a cathode connected to the third boost node N5. The fourth diode 18 has an anode connected to the third boost node N5 and a cathode connected to the fourth boost node N6. The fifth diode 19 has an anode connected to the fourth boost node N6 and a cathode connected to the output node 8.

In other words, one electrode of each of the MOS capacitors 11 to 14 is connected to the associated one of the boost nodes N1, N3, N5 and N6 of the serially-connected diodes 15 to 19, while the other electrode is fed with a clock signal.

The power supply circuit 3 generates a power supply voltage VDD, and supplies the power supply voltage VDD to the anode of the diode 15.

The oscillation circuit 4 generates a clock signal with a constant cycle period. In this embodiment, the signal level of the generated clock signal is switched between the power supply voltage VDD and the ground voltage VSS.

The first inverter 5 generates a clock signal having an opposite phase to that of the clock signal received from the oscillation circuit 4. In the following, the clock signal output from the first inverter 5 is referred to as the non-inverted clock signal. The first inverter 5 is connected to the first MOS capacitor 11 through the first clock supply node N2. The first inverter 5 is also connected to the third MOS capacitor 13 through the first clock supply node N2.

The second inverter 6 receives the non-inverted clock signal from the first inverter 5, and generates an inverted clock signal having an opposite phase to that of the received non-inverted clock signal. The second inverter 6 is connected to the second MOS capacitor 12 through the second clock supply node N4. The second inverter 6 is also connected to the fourth MOS capacitor 14 through the second clock supply node N4.

The charge pump circuit 2 operates as follows: The first inverter 5 supplies the non-inverted clock signal to the first clock supply node N2, while the second inverter supplies the inverted clock signal to the second clock supply node N4. As a result, the first to fourth MOS capacitors 11 to 14 alternately receives the power supply voltage VDD and the reference voltage VSS with a constant cycle period. The diodes 15 to 19 each output from the cathode thereof the voltage boosted by the MOS capacitor connected with the anode thereof. In detail, as shown in FIG. 2, the electric charges accumulated in one MOS capacitor are unidirectionally transferred to the adjacent MOS capacitor through the diode connected therebetween. Repeatedly charging and discharging the MOS capacitors results in that the electric charges accumulated in the respective MOS capacitors 11 to 14 are successively added and transferred to the output node 8. Accordingly, the charge pump circuit 2 externally outputs a boosted voltage higher than the power supply voltage VDD from the output node 8.

Figure 3:
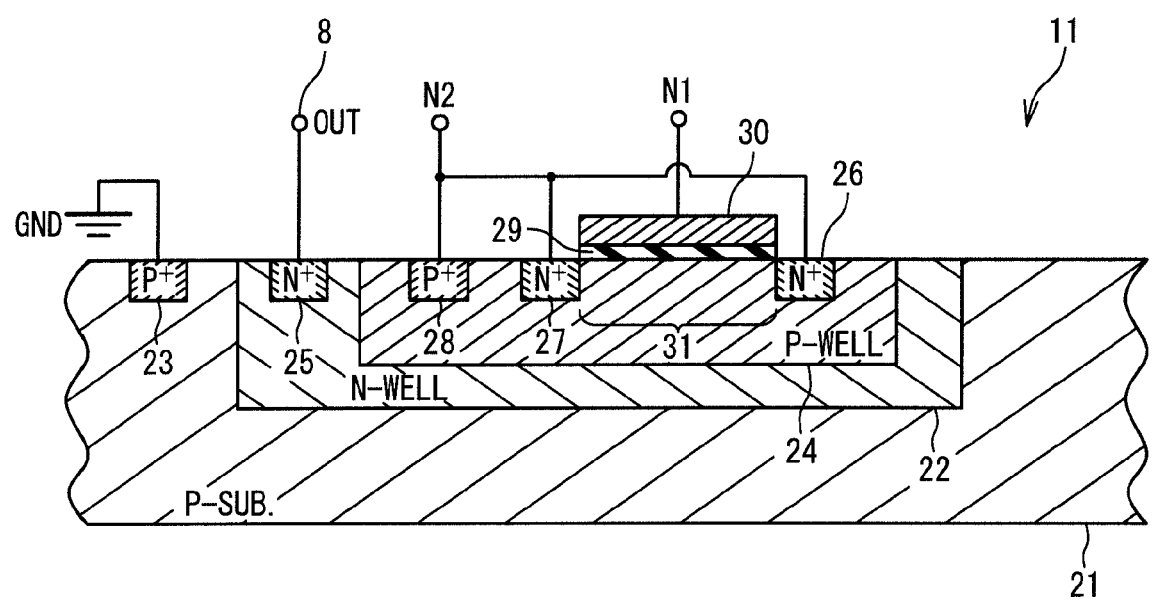
FIG. 3 is a cross sectional view showing an exemplary structure of a capacitor integrated within the charge pump circuit of FIG. 2.

The following is an explanation of an exemplary structure of the MOS capacitors 11 to 14 within the charge pump circuit 2. In this embodiment, the MOS capacitors 11 to 14 are structured identically to one another, and therefore, a description is given only for the first MOS capacitor 11. FIG. 3 is a cross sectional diagram showing an exemplary structure of the first capacitor 11 in the present embodiment. The first capacitor 11 is provided with an N-well 22 formed within a P-type semiconductor substrate 21, and a P-well 24 within on the N-well 22.

The P-well 24 is provided with first and second $N^+$ diffusion regions 26, 27, and a $P^+$ diffusion region 28. It should be noted that the $N^+$ diffusion region means a semiconductor region that is heavily doped with N-type dopants, and the $P^+$ diffusion region means a semiconductor region that is heavily doped with P-type dopants. A channel region 31 is provided between the first and second $N^+$ diffusion region 26 and 27. A dielectric film 29 is formed on the channel region 31, and a gate electrode 30 is formed on the dielectric film 29; the gate electrode 30 is positioned over the channel region 31 across the dielectric film 29. Additionally, a $P^+$ diffusion region 23 is formed within the P-type semiconductor substrate 21. The $P^+$ diffusion region 23 is biased with the ground voltage VSS.

As shown in FIG. 3, the first and second $N^+$ diffusion region 26, 27 and the $P^+$ diffusion region 28 of the first MOS capacitor 11 are connected to the first clock supply node N2, which is connected to the output of the fist inverter 5.

In the present embodiment, an $N^+$ diffusion region 25 is formed within the N-well 22. As shown in FIG. 3, the $N^+$ diffusion region 25 of the first MOS capacitor 11 is connected to the output node 8.

The other MOS capacitors (that is, the second to fourth MOS capacitors 12 to 14) are structured identically to the first MOS capacitor 11. It should be noted, however, that the first $N^+$ diffusion region 26, the second $N^+$ diffusion region 27, and the $P^+$ diffusion region 28 of the second and fourth MOS capacitors 12 and 14 are connected to the second clock supply node N4, which is connected to the output of the second inverter 6, instead of the first clock supply node N2. The first $N^+$ diffusion region 26, the second $N^+$ diffusion region 27, and the $P^+$ diffusion region 28 of the third MOS capacitor 13 are connected to the first clock supply node N2 as is the case of the first MOS capacitor 11.

It should be additionally noted that the $N^+$ diffusion regions 25 of all of the first to fourth MOS capacitors 11 to 14 are connected to the output node 8. This effectively reduces the parasitic capacitance between the N-well 22 and the P-well 24 in each MOS capacitor, and thereby reduces the current consumption in the booster circuit 1. The electrical connection between the output node 8 and the N-well 22 of each MOS capacitor enlarges the reverse bias applied between the N-well 22 and the P-well 24 in each MOS capacitor, because the N-well 22 receives a higher voltage from the output node 8; the voltage developed on the output node 8 is higher than the power supply voltage VDD. In one embodiment, the voltage developed on the output node 8 is 20 V, when the power supply voltage VDD is 5 V. The enlarged reverse bias increases the depletion layer width between the N-well 22 and the P-well 24, and thereby reduces the parasitic capacitance therebetween. Therefore, the electrical connection between the output node 8 and the N-well 22 of each MOS capacitor effectively reduces the current consumption of the booster circuit 1.

It is apparent that the present invention is not limited to the above embodiments, but may be modified and changed without departing from the scope of the invention. It should be noted, for example, the MOS capacitor according to the present invention may be used in circuits other than the booster circuit. It should be also noted that the MOS capacitor according to the present invention may be formed by using an N-type semiconductor substrate, instead of the P-type semiconductor substrate. In this case, the conductivity types of the respective wells and diffusion regions are modified accordingly.

What is claimed is:

1. A charge pump circuit comprising:
   at least one capacitor for generating a boosted voltage from a power supply voltage in response to a clock signal; and
   an output node from which said boosted voltage is externally outputted,
   wherein said at least one capacitor includes:
   a first well formed within a substrate;
   a second well formed within said first well;
   first and second diffusion regions formed within said second well to receive said clock signal;
   a channel region provided between said first and second diffusion regions in which channel region a channel is formed in response to said clock signal;
   an electrode positioned over said channel region across a dielectric film and connected with said output node, and
   wherein said output node is connected with said first well to apply said boosted voltage to said first well.

2. The charge pump circuit according to claim 1, wherein said at least one capacitor includes:
   a first capacitor receiving said clock signal;
   a second capacitor receiving an inverted clock signal having an opposite phase to that of said clock signal, and
   wherein said first and second capacitors are connected through a diode.

3. The charge pump circuit according to claim 2, wherein said capacitor further includes a third diffusion region formed within said second well,
   wherein said first and second diffusion regions have a first conductivity type, and
   wherein said third diffusion region has a conductivity type different from that of said first and second diffusion regions.

4. The charge pump circuit according to claim 3, wherein one terminal of said first capacitor receives said clock signal, and another terminal of said first capacitor is connected with an anode of said diode, and
   wherein one terminal of said second capacitor receives said inverted clock signal, and another terminal of said second capacitor is connected with a cathode of said diode.

5. The charge pump circuit according to claim 4, wherein said substrate is a P-type semiconductor substrate,
   wherein said first well is an N-well,
   wherein said second well is a P-well,
   wherein said first and second diffusion regions are $N^+$ diffusion regions, and
   wherein said third diffusion region is a $P^+$ diffusion region.

6. A booster circuit comprising:
   a power supply circuit providing a power supply voltage;
   a charge pump circuit generating a boosted voltage through boosting said power supply voltage;
   an oscillation circuit providing a clock signal;
   an output node from which said boosted voltage is externally outputted,
   wherein said charge pump circuit includes a capacitor for generating said boosted voltage from said power supply voltage in response to a clock signal; and
   wherein said capacitor includes:
   a first well formed within a substrate;
   a second well formed within said first well;
   first and second diffusion regions formed within said second well to receive said clock signal;
   a channel region provided between said first and second diffusion regions in which channel region a channel is formed in response to said clock signal;
   an electrode positioned over said channel region across a dielectric film and connected with said output node, and
   wherein said output node is connected with said first well to apply said boosted voltage to said first well.

7. A capacitor to be used in a charge pump circuit generating a boosted voltage through boosting a power supply voltage in response to a clock signal, said capacitor comprising:
   a first well formed within a substrate;
   a second well formed within said first well;
   first and second diffusion regions formed within said second well to receive said clock signal;
   a channel region provided between said first and second diffusion regions in which channel region a channel is formed in response to said clock signal;
   an electrode positioned over said channel region across a dielectric film and connected with said output node, and
   wherein said first well is connected to an output node of said charge pump to receive said boosted voltage from said output node.

8. A charge pump circuit comprising:
   a first capacitor accumulating electric charges in response to a non-inverted clock signal;
   a second capacitor accumulating electric charges in response to an inverted clock signal;
   a first diode having an anode connected with a power supply circuit and a cathode connected to said first capacitor;
   a second diode connected between said first and second capacitors, and
   an output node electrically connected to a connection node of said second capacitor and said second diode, said output node outputting a boosted voltage generated from a voltage developed on said connection node,
   wherein each of said first and second capacitors includes:
   an N-well formed within a P-type substrate;
   a P-well formed within said N-well;
   first and second $N^+$ diffusion regions formed within said P-well;
   a first $P^+$ diffusion region formed within said P-well;
   a channel region provided between said first and second $N^+$ diffusion regions in which channel region a channel is formed in response to said clock signal;
   an electrode positioned over said channel region across a dielectric film and connected with said output node,
   a third $N^+$ region formed within said N-well; and
   a second $P^+$ region formed within said P-type semiconductor substrate,
   wherein said first and second $N^+$ diffusion regions and said first $P^+$ diffusion region of said first capacitor receive said non-inverted clock signal,
   wherein said first and second $N^+$ diffusion regions and said first $P^+$ diffusion region of said second capacitor receive said inverted clock signal,
   wherein said output node is connected to said third $N^+$ diffusion region of each of said first and second capacitors to apply said boosted voltage to said third $N^+$ diffusion region.

9. The charge pump circuit according to claim 8, further comprising:
   a third capacitor accumulating electric charges in response to said non-inverted clock signal;
   a fourth capacitor accumulating electric charges in response to said inverted clock signal;

a third diode connected between said second and third capacitors;
a fourth diode connected between said third and fourth capacitors; and
a fifth diode connected between said fourth capacitor and said output node,
wherein each of said third and fourth capacitors includes:
an N-well formed within a P-type substrate;
a P-well formed within said N-well;
first and second $N^+$ diffusion regions formed within said P-well;
a first $P^+$ diffusion region formed within said P-well;
a channel region provided between said first and second $N^+$ diffusion regions in which channel region a channel is formed in response to said clock signal;
an electrode positioned over said channel region across a dielectric film and connected with said output node,
a third $N^+$ region formed within said N-well; and
a second $P^+$ region formed within said P-type semiconductor substrate,
wherein said first and second $N^+$ diffusion regions and said first $P^+$ diffusion region of said third capacitor receive said non-inverted clock signal,
wherein said first and second $N^+$ diffusion regions and said first $P^+$ diffusion region of said fourth capacitor receive said inverted clock signal,
wherein said output node is connected to said third $N^+$ diffusion region of each of said third and fourth capacitors to apply said boosted voltage to said third $N^+$ diffusion region.

* * * * *